(12) United States Patent
Shimizu et al.

(10) Patent No.: US 8,405,067 B2
(45) Date of Patent: Mar. 26, 2013

(54) NITRIDE SEMICONDUCTOR ELEMENT

(75) Inventors: Jun Shimizu, Toyama (JP); Shinichi Kohda, Kyoto (JP); Yasuhiro Yamada, Hyogo (JP); Naohide Wakita, Osaka (JP); Masahiro Ishida, Osaka (JP)

(73) Assignee: Panasonic Corporation, Osaka (JP)

( * ) Notice: Subject to any disclaimer, the term of this patent is extended or adjusted under 35 U.S.C. 154(b) by 239 days.

(21) Appl. No.: 12/961,134

(22) Filed: Dec. 6, 2010

(65) Prior Publication Data
US 2011/0248241 A1    Oct. 13, 2011

(30) Foreign Application Priority Data

Apr. 8, 2010   (JP) .................. 2010-089842

(51) Int. Cl.
*H01L 29/06*      (2006.01)
*H01L 31/0328*    (2006.01)
*H01L 31/0336*    (2006.01)
*H01L 31/072*     (2012.01)
*H01L 31/109*     (2006.01)

(52) U.S. Cl. ............ 257/15; 257/77; 257/E29.072

(58) Field of Classification Search ............. 257/15, 257/76, 77, E29.072
See application file for complete search history.

(56) References Cited

U.S. PATENT DOCUMENTS
2001/0035531 A1   11/2001  Kano et al.
2004/0119063 A1   6/2004   Guo et al.
2007/0045639 A1   3/2007   Kato et al.
2008/0203382 A1   8/2008   Yanagihara
2009/0001384 A1*  1/2009   Kosaki et al. .......... 257/77
2009/0200645 A1   8/2009   Kokawa et al.
2010/0078678 A1*  4/2010   Kokawa et al. .......... 257/183
2012/0223328 A1*  9/2012   Ikuta et al. .......... 257/76

FOREIGN PATENT DOCUMENTS
JP    2001-274096    10/2001

OTHER PUBLICATIONS

Shinichi Iwakami et al., "AlGaN/GaN Heterostructure Field-Effect Transistors (HFETs) on Si Substrate for Large-Current Operation," Japanese Journal Appl. Phys., 2004, vol. 43, p. L831.

* cited by examiner

*Primary Examiner* — David S Blum
(74) *Attorney, Agent, or Firm* — McDermott Will & Emery LLP

(57) ABSTRACT

A nitride semiconductor element includes: a strain suppression layer formed on a silicon substrate via an initial layer; and an operation layer formed on the strain suppression layer. The strain suppression layer includes a first spacer layer, a second spacer layer formed on and in contact with the first spacer layer, and a superlattice layer formed on and in contact with the second spacer layer. The first spacer layer is larger in lattice constant than the second spacer layer. The superlattice layer has first layers and second layers smaller in lattice constant than the first layers stacked alternately on top of one another. The average lattice constant of the superlattice layer is smaller than the lattice constant of the first spacer layer and larger than the lattice constant of the second spacer layer.

22 Claims, 3 Drawing Sheets

NITRIDE SEMICONDUCTOR ELEMENT

CROSS-REFERENCE TO RELATED APPLICATION

This application claims priority to Japanese Patent Application No. 2010-089842 filed on Apr. 8, 2010, the disclosure of which including the specification, the drawings, and the claims is hereby incorporated by reference in its entirety.

BACKGROUND

The present disclosure relates to a nitride semiconductor element, and more particularly to a nitride semiconductor element formed on a silicon substrate.

Gallium nitride (GaN) that is a nitride semiconductor has a high electron saturation velocity and a high breakdown electric field. Also, having high thermal conductivity, GaN is excellent in heat dissipation, and thus has a feature of being operable at high temperature. Moreover, highly concentrated two-dimensional electron gas (2DEG) is generated at the heterointerface between aluminum gallium nitride (AlGaN) and GaN due to the piezoelectric effect. Using 2DEG as a channel, large-current operation can be achieved, and thus implementation of low-loss, high-efficiency power devices represented by heterostructure field effect transistors (HFETs) is expected.

A nitride semiconductor layer having a good crystal structure can be formed easily if the substrate on which the nitride semiconductor layer is grown is a GaN substrate whose lattice constant matches with that of the nitride semiconductor layer. However, a GaN substrate is expensive, and therefore, it has been examined to form a nitride semiconductor layer on an inexpensive substrate such as a sapphire substrate and a silicon (Si) substrate. Since sapphire and Si are largely different in crystal lattice constant from nitride semiconductors, nitride semiconductor layers grown on such substrates are likely to have lattice defects. Lattice defects tend to cause leakage currents and current collapse. For this reason, attempts have been made to form an undoped GaN layer and then a superlattice layer, constructed of indium gallium nitride (InGaN) and AlGaN stacked on top of each other, on a sapphire substrate, thereby to reduce lattice defects of a nitride semiconductor layer formed on the superlattice layer (see Japanese Patent Publication No. 2001-274096, for example).

A sapphire substrate is less expensive than a GaN substrate, but is more expensive and smaller in substrate diameter than a Si substrate. Therefore, to further reduce the cost of power devices, it has been examined to form a nitride semiconductor element using a Si substrate that is inexpensive and easily available as a large-diameter substrate. Using a Si substrate, the difference in lattice constant from a nitride semiconductor layer is larger than using a sapphire substrate. In addition, the difference in thermal expansion coefficient between a Si substrate and a nitride semiconductor layer is very large, resulting in that cracks tend to be generated in the nitride semiconductor layer grown on the Si substrate. To reduce occurrence of cracks, therefore, it has been examined to form a superlattice layer, constructed of a GaN layer and an aluminum nitride (AlN) layer stacked on top of each other, between the Si substrate and the operation layer (see Shinichi IWAKAMI, Masataka YANAGIHARA, Osamu MACHIDA, Emiko CHINO, Nobuo KANEKO, Hirokazu GOTO, and Kohji OHTSUKA, "AlGaN/GaN Heterostructure Field-Effect Transistors (HFETs) on Si Substrate for Large-Current Operation," Jpn. J. Appl. Phys., 2004, vol. 43, p. L831).

SUMMARY

It has been found that the following problem arises in formation of a nitride semiconductor element on a Si substrate using the conventional GaN/AlN stacked superlattice layer. For cost reduction, it is preferable to use a large-diameter Si substrate for formation of nitride semiconductor elements. Also, it is necessary to minimize occurrence of defectives. However, if nitride semiconductor layers are formed on a large-diameter Si substrate, warpage will be very large. In the conventional method, therefore, it is difficult to suppress or reduce occurrence of warpage-caused cracks and substrate fractures. Thus, despite use of a large-diameter Si substrate, the yield will be low, failing to improve productivity. In particular, in power devices, in which a comparatively thick semiconductor layer must be formed on the substrate to secure the dielectric strength, warpage tends to be further large. It has been found that, in the conventional method, use of a Si substrate having a diameter of 75 mm (3 inches) or more is practically impossible.

It has also been found that warpage will become further large if a GaN layer and an InGaN/AlGaN stacked superlattice layer are formed on a Si substrate, as in the case of a sapphire substrate, in an attempt to reduce occurrence of lattice defects.

It is an objective of the present disclosure to improve the productivity and operation characteristics of a nitride semiconductor element formed on a Si substrate.

To attain the above objective, according to the present disclosure, an example nitride semiconductor element includes a strain suppression layer that has a first nitride semiconductor layer, a second nitride semiconductor layer smaller in lattice constant than the first nitride semiconductor layer, and a superlattice layer having an average lattice constant smaller than the lattice constant of the first nitride semiconductor layer and larger than the lattice constant of the second nitride semiconductor layer.

Specifically, the example nitride semiconductor element includes: a silicon substrate; a strain suppression layer formed on the silicon substrate via an initial layer; and an operation layer formed on the strain suppression layer. The strain suppression layer includes a first spacer layer made of a first nitride semiconductor, a second spacer layer formed on and in contact with the first spacer layer, the second spacer layer being made of a second nitride semiconductor smaller in lattice constant than the first nitride semiconductor, and a superlattice layer formed on and in contact with the second spacer layer, the superlattice layer having first layers made of a third nitride semiconductor and second layers made of a fourth nitride semiconductor smaller in lattice constant than the third nitride semiconductor stacked alternately on top of one another. The average lattice constant of the superlattice layer is smaller than the lattice constant of the first spacer layer and larger than the lattice constant of the second spacer layer.

The example nitride semiconductor element can have a balance between compressive strain and tensile strain, and thus can reduce the warpage of the Si substrate and the nitride semiconductor layers formed thereon. Also, with the strain suppression layer including the superlattice layer, the distance between the operation layer and the silicon substrate

DETAILED DESCRIPTION

Figure 1:
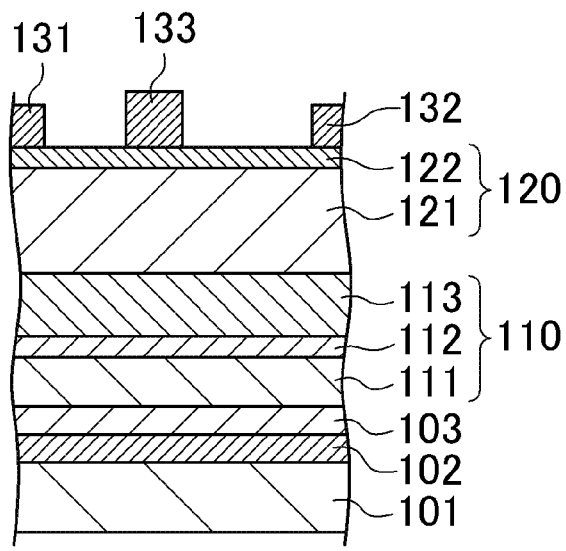
FIG. 1 is a cross-sectional view of an example semiconductor element.

As shown in FIG. 1, an example nitride semiconductor element includes an initial layer 102 made of aluminum nitride (AlN) and an intermediate layer 103 made of AlGaN formed in this order on a silicon (Si) substrate 101 whose principal surface is (111) plane. A strain suppression layer 110 and an operation layer 120 are formed sequentially on the intermediate layer 103. The initial layer 102 is provided for suppressing or reducing reaction between Si and Ga. If the initial layer 102 is thinner than about 5 nm, it will be difficult to grow a semiconductor layer with a mirror surface thereon. Conversely, if the initial layer 102 is thicker than about 500 nm, cracks will often occur in a semiconductor layer formed thereon. The intermediate layer 103 may be made of $Al_{0.3}Ga_{0.7}N$ having a thickness of 40 nm, for example, although the Al content may be changed appropriately. The intermediate layer 103 may be formed as required; the strain suppression layer 110 may be formed directly on the initial layer 102.

Figure 2:
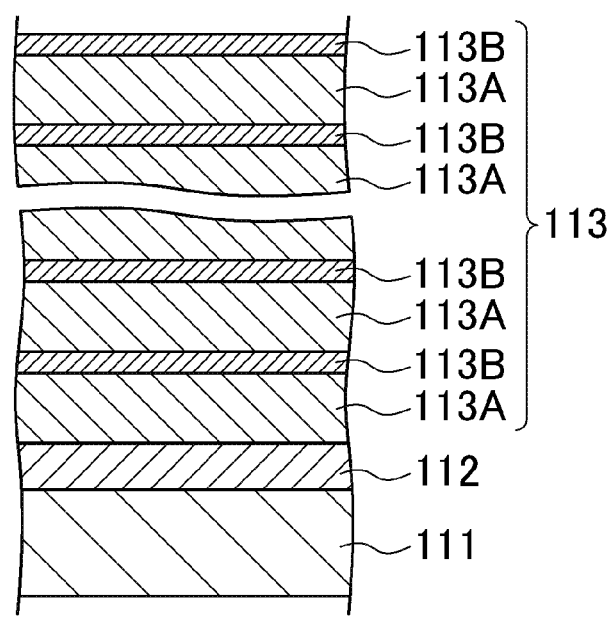
FIG. 2 is an enlarged cross-sectional view of a strain suppression layer.

As shown in FIG. 2, the strain suppression layer 110 includes a first spacer layer 111 made of GaN, a second spacer layer 112 made of AlN, and a superlattice layer 113 formed sequentially. The superlattice layer 113 includes first layers 113A made of AlGaN and second layers 113B made of AlN stacked alternately on top of one another.

The operation layer 120 includes a channel layer 121 made of GaN and a barrier layer 122 made of AlGaN formed sequentially on the strain suppression layer 110. On the barrier layer 122, a source electrode 131 and a drain electrode 132 are formed with spacing from each other, and a gate electrode 133 is formed between the source electrode 131 and the drain electrode 132.

Figure 3:
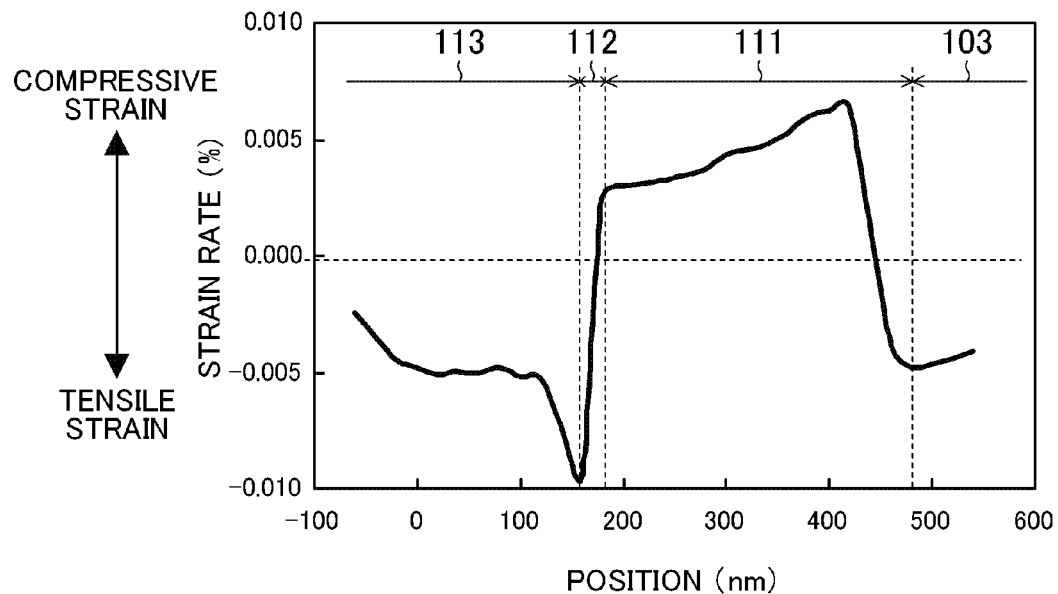
FIG. 3 is a graph showing the state of crystal strain of the strain suppression layer.

Next, the principle based on which warpage of the substrate and the semiconductor layers formed thereon of the example nitride semiconductor element can be reduced will be described. FIG. 3 shows the state of strain in the strain suppression layer 110 of the example nitride semiconductor element. In FIG. 3, the x-axis represents the depth from the top surface of the superlattice layer 113 as zero, and the y-axis represents the strain rate of crystal. A positive strain rate indicates presence of compressive strain, and a negative strain rate indicates presence of tensile strain. The strain rate was measured by electron back scattering diffraction (EBSD). As the first spacer layer 111, GaN having a thickness of about 300 nm was used, and as the second spacer layer 112, $Al_{0.3}Ga_{0.7}N$ having a thickness of about 20 nm was used. As the superlattice layer 113, a total of 19 pairs of the first layers 113A formed of $Al_{0.3}Ga_{0.7}N$ each having a thickness of 20 nm and the second layers 113B formed of AlN each having a thickness of about 3 nm were stacked alternately on top of one another. Arrangement was made so that the bottommost layer of the superlattice layer 113 was a first layer 113A and the topmost layer thereof was a second layer 113B. As the intermediate layer 103, $Al_{0.3}Ga_{0.7}N$ having a thickness of 40 nm was used.

As shown in FIG. 3, while the intermediate layer 103 has tensile strain, the strain direction changes to compressive strain in the first spacer layer 111 made of GaN. The compressive strain is largest at a position about 40 nm from the interface between the intermediate layer 103 and the first spacer layer 111, and then gradually decreases. In the second spacer layer 112 made of AlN, the strain direction sharply changes from the compressive strain to tensile strain, and the tensile strain is largest near the interface between the second spacer layer 112 and the superlattice layer 113. In the superlattice layer 113, the tensile strain is maintained although the magnitude is decreasing.

The inventors of the present disclosure have found that warpage can be reduced by allowing the first spacer layer 111 to have compressive strain, changing the strain direction to tensile strain sharply near the interface between the first spacer layer 111 and the second spacer layer 112, and placing the superlattice layer having weak tensile strain on the second spacer layer 112, as shown in FIG. 3. The cause of this phenomenon is not clear, but seems to be that, with formation of a layer subjected to large tensile strain in contact with a layer subjected to compressive strain, it is possible to strike a balance between the compressive strain and the tensile strain.

To allow the first spacer layer 111 to have compressive strain, the first spacer layer 111 may be formed of a material having a large lattice constant. To allow the strain rate to change largely near the interface between the first spacer layer 111 and the second spacer layer 112, the lattice constant of the second spacer layer 112 may be made small to increase the difference in lattice constant between the first spacer layer 111 and the second spacer layer 112. Accordingly, the first spacer layer 111 is preferably made of GaN containing no Al, and the second spacer layer 112 is preferably made of AlN containing no Ga. Note however that, as far as the difference in lattice constant between the first spacer layer 111 and the second spacer layer 112 is secured, the first spacer layer 111 may contain Al and the second spacer layer 112 may contain Ga. In this case, the Al content of the first spacer layer 111 should be smaller than the Al contents of the second spacer layer 112 and the intermediate layer 103. It is also possible to add In to increase the lattice constant of the first spacer layer 111. When In is added, however, it is necessary to decrease the growth temperature and use a hydrogen-free carrier gas. Thus, use of GaN is most preferable from the standpoint of easiness of production.

The first spacer layer 111 needs only to have a thickness with which compressive strain occurs. However, a thickness more than about 40 nm is preferable because variations will be large where the strain changes largely. If the thickness is two large, the effect of causing compressive strain will decrease. No compressive strain will occur when the thickness is about 500 nm, and tensile strain will occur instead when the thickness exceeds 500 nm. Therefore, the thickness is preferably less than about 500 nm, and more preferably in the range of about 100 nm to about 300 nm considering the magnitude of the compressive strain caused.

The second spacer layer 112 needs only to have a thickness with which the compressive strain having occurred in the first spacer layer 111 is canceled and tensile strain is caused. FIG.

Figure 4:
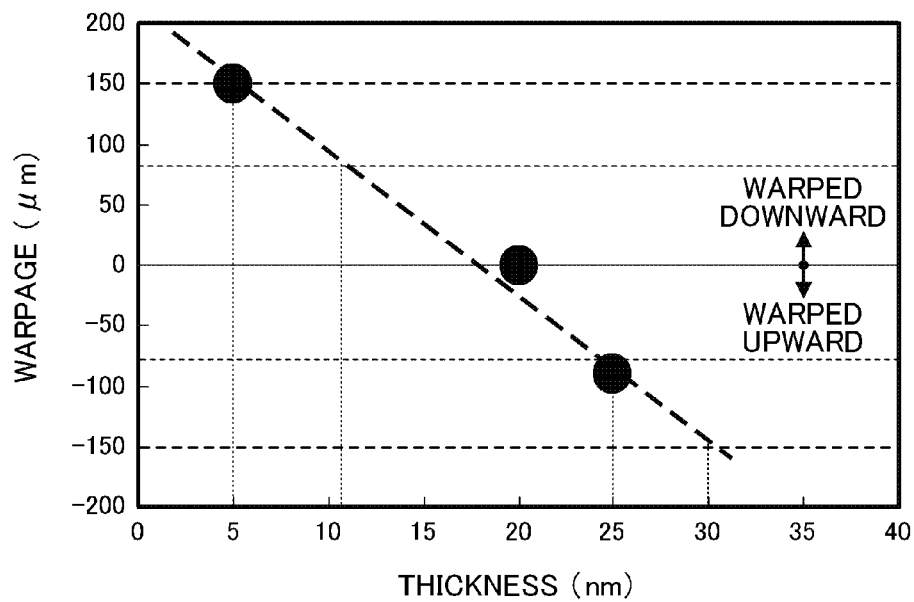
FIG. 4 is a graph showing the relationship between the thickness of a second spacer layer and the warpage of a substrate.

4 shows the relationship between the thickness of the second spacer layer 112 and the warpage of the substrate. In FIG. 4, the x-axis represents the thickness of the second spacer layer 112 and the y-axis represents the magnitude of the warpage of the substrate. A positive warpage value indicates that the surface on which the nitride semiconductor layers are formed is warped in a concave shape, or warped downward, and a negative warpage value indicates that the surface is warped in a convex shape, or warped upward. Without existence of the second spacer layer 112, the substrate is largely warped downward. As shown in FIG. 4, even with existence of the second spacer layer 112, the substrate is still warped downward as far as the thickness of the second spacer layer 112 is small. The reason for this seems to be that, with a thin second spacer layer 112, the effect of the compressive strain of the first spacer layer 111 cannot be canceled. As the thickness of the second spacer layer 112 is larger, the warpage of the substrate gradually decreases. Once the thickness exceeds about 20 nm, upward warpage occurs, possibly because the tensile strain becomes too large.

If the warpage of the substrate is larger than 150 nm, problems such as occurrence of cracks in the nitride semiconductor layers and fractures of the substrates will occur very easily. Therefore, the thickness of the second spacer layer 112 should be in the range of about 5 nm to about 30 nm. Also, if the warpage of the substrate is larger than 80 nm, it will be difficult to hold the substrate with a vacuum chuck, reducing the productivity. Therefore, the thickness of the second spacer layer 112 is preferably in the range of about 10 nm to about 25 nm.

As for the superlattice layer 113, the average lattice constant determined according to the rule should be a value between the lattice constants of the first spacer layer 111 and the second spacer layer 112. As far as the lattice constant can be set to a value between those of the first and second spacer layers 111 and 112, the layer formed on the second spacer layer 112 is not necessarily a superlattice layer. Use of the superlattice layer 113, however, can reduce occurrence of cracks more effectively. Also, the entire of the strain suppression layer 110 can be thickened, providing the effect of improving the dielectric strength of the semiconductor element.

The thicknesses of the first layers 113A and the second layers 113B may be in the range of about 20 nm to about 30 nm and in the range of about 3 nm to 6 nm, respectively. If the first layers 113A and the second layers 113B are thick beyond these ranges, the balance will be lost as the superlattice structure, causing the substrate to be largely warped downward. In particular, the second layers 113B should preferably be thinner than the second spacer layer 112.

The superlattice layer 113 can be constructed of two first layers 113A and one second layer 113B at the minimum. However, to provide an appropriate magnitude of strain, the superlattice layer 113 preferably includes three or more first layers 113A and three or more second layers 113B. The larger the number of layers stacked, the thicker the superlattice layer becomes, permitting improvement of the dielectric strength of the semiconductor element. However, it has been confirmed that stacking of 160 or more first layers 113A and 160 or more second layers 113B causes large downward warpage of the substrate. Also, an increased number of layers stacked on top of one another will increase the crystal growth time, and increase the amount of the materials used, resulting in increasing the production cost. Practically, the number of layers is preferably 50 or less for each of the first layers 113A and the second layers 113B, and more preferably 20 or less. The bottommost layer of the superlattice layer 113 is prefer-ably a first layer 113A that is large in lattice constant. If a second layer 113B that is small in lattice constant is placed as the bottommost layer, it is necessary to adjust the thickness of the second spacer layer 112 to ensure that the tensile strain does not become too large. As the topmost layer of the superlattice layer 113, either a first layer 113A or a second layer 113B may be placed.

A larger difference in lattice constant between the first layers 113A and the second layers 113B is more preferable. Therefore, the first layers 113A may be made of GaN containing no Al, and the second layer 113B may be made of AlN containing no Ga. However, the inventors of the present disclosure have found that the first layers 113A made of GaN decrease the dielectric strength of the semiconductor element.

Figure 5:
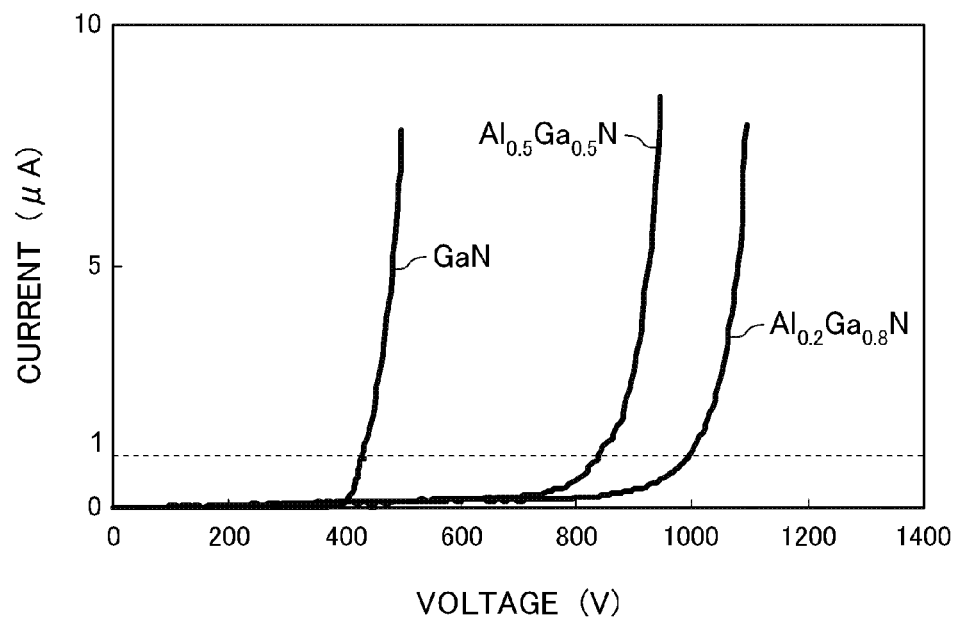
FIG. 5 is a graph showing the dielectric strength of the semiconductor element.

FIG. 5 shows the relationship between the composition of the first layers 113A and the dielectric strength of the semiconductor element. In FIG. 5, the x-axis represents the voltage between the Si substrate 101 and the drain electrode 132, and the y-axis represents the current between the Si substrate 101 and the drain electrode 132. The samples used for the measurement have the same configuration except for the composition of the first layers 113A. As shown in FIG. 5, when the first layers 113A are made of GaN, the substrate-electrode current sharply rises when the voltage applied between the substrate and the electrode is about 400 V, indicating that the breakdown voltage of the semiconductor element is about 400 V. When the first layers 113A are made of $Al_{0.2}Ga_{0.8}N$, the breakdown voltage rises to as high as about 1000 V. When the Al content of the first layers 113A is further increased to $Al_{0.5}Ga_{0.5}N$, the breakdown voltage decreases to about 800 V. The reason why the dielectric strength is high when AlGaN is used as the first layers 113A is not clear, but seems to be that use of AlGaN smaller in lattice constant than GaN as the first layers 113A may improve the crystallinity, etc. of the operation layer 120 formed on the strain suppression layer 110. Accordingly, it is preferable to use $Al_xGa_{1-x}N$ as the first layers 113A where the Al content x is larger than zero for improvement of the dielectric strength of the semiconductor element. In the case that the first spacer layer 111 is made of AlGaN, the first layers 113A is preferably larger in Al content and smaller in lattice constant than the first spacer layer 111. However, an excessively large Al content x will not only decrease the effect of improving the dielectric strength but also decrease the effect of decreasing warpage. Therefore, the Al content x is preferably 0.5 or less, and more preferably about 0.2 or 0.3. The Al content x may be further reduced as far as the required dielectric strength is secured. Also, to widen the difference in lattice constant from the first layers 113A, the second layers 113B are preferably made of AlN containing no Ga, but it may be made of $Al_yGa_{1-y}N$ ($x<y\leq1$) that is smaller in lattice constant than the first layers 113A. It should be ensured, however, that the average lattice constant of the superlattice layer 113 is smaller than the lattice constant of the first spacer layer 111 and larger than that of the second spacer layer 112.

The surface flatness and the crystal characteristics can be improved when the channel layer 121 made of undoped GaN is thickened to some extent. The dielectric strength of the semiconductor element can also be improved with a thick channel layer. Therefore, the thickness of the channel layer 121 is preferably more than about 0.5 μm. If the thickness exceeds 6 μm, abnormal growth is likely to occur at the end faces of the substrate in particular. Thus, the thickness is preferably smaller than about 6 μm.

The barrier layer 122 may be made of $Al_{0.25}Ga_{0.75}N$ having a thickness of 25 nm, for example. The Al content and thickness of the barrier layer 122 may be changed appropriately as required. An impurity such as Si may be added to the barrier layer 122. The barrier layer 122 may be of a multilayer structure including a plurality layers different in Al content, impurity concentration, etc.

The source electrode 131 and the drain electrode 132 may be formed using a metal capable of ohmic contact. The source electrode 131 and the drain electrode 132 may have a recess structure. The gate electrode 133 may be formed using a metal capable of Schottky contact. The gate electrode 133 may also have a recess structure. Otherwise, a p-type nitride semiconductor layer may be formed between the gate electrode 133 and the barrier layer 122, to allow the gate electrode 133 to be in ohmic contact with the p-type nitride semiconductor layer. Each of the electrodes may be of a multilayer structure or an alloy structure, or otherwise may be an electrode made of a material other than metal. In place of the source electrode 131, the drain electrode 132, and the gate electrode 133, an anode electrode in ohmic contact and a cathode electrode in Schottky contact may be formed to implement a Schottky barrier diode.

The initial layer 102, the intermediate layer 103, the strain suppression layer 110, and the operation layer 120 may be formed by metal organic chemical vapor deposition (MOCVD) or the like. In MOCVD, trimethylgallium may be used as the source material for Ga, trimethylaluminum as the source material for Al, and ammonia as the source material for N. In place of MOCVD, hydride vapor phase epitaxy may be employed.

Figure 6:
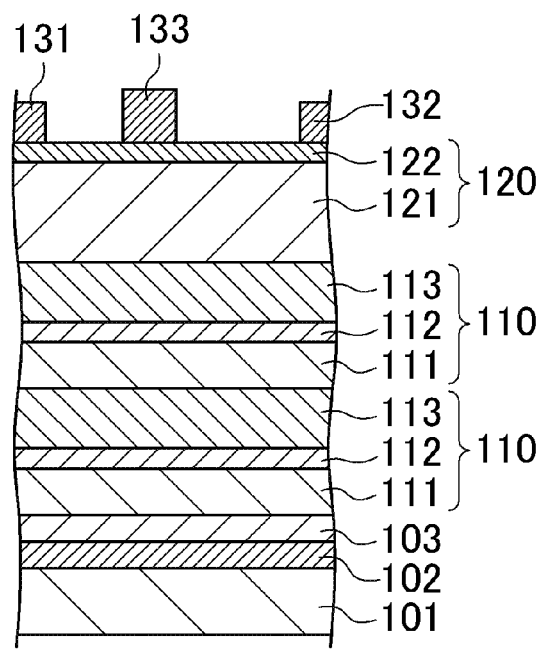
FIG. 6 is a cross-sectional view of a variation of the semiconductor element.

As shown in FIG. 6, two strain suppression layers 110 may be formed. With formation of a plurality of strain suppression layers 110, the warpage of the substrate can be further reduced. Also, since the distance between the channel layer 121 and the Si substrate 101 increases, the dielectric strength of the semiconductor element can be further improved. Three or more strain suppression layers 110 may be formed, but an increased number of strain suppression layers will increase the crystal growth time, and increase the amount of materials required, resulting in increasing the production cost. Such strain suppression layers 110 do not necessarily have completely the same configuration.

By forming the operation layer on the strain suppression layers configured as described above, the warpage of even a Si substrate having a diameter of 75 mm (3 inches) or 150 mm (6 inches) or larger can be reduced to a minimum. This makes it possible to reduce occurrence of cracks, occurrence of substrate fractures, etc., and hence greatly improve the productivity of the nitride semiconductor element. The effect of reducing the warpage of the substrate can also be obtained when a small-diameter Si substrate is used. Thus, the productivity and the yield can be improved also in this case. Moreover, with the capability of improving the dielectric strength of the semiconductor element, it is possible to implement a structure especially suitable for power devices and the like using nitride semiconductors.

As described above, according to the present disclosure, it is possible to improve the productivity and operation characteristics of nitride semiconductor elements formed on a Si substrate, and thus such nitride semiconductor elements can be especially useful as power devices.

What is claimed is:
1. A nitride semiconductor element, comprising:
a silicon substrate;
a strain suppression layer formed on the silicon substrate via an initial layer; and
an operation layer formed on the strain suppression layer, wherein;
the strain suppression layer includes:
a first spacer layer made of a first nitride semiconductor;
a second spacer layer formed on and in contact with the first spacer layer, the second spacer layer being made of a second nitride semiconductor smaller in lattice constant than the first nitride semiconductor; and
a superlattice layer formed on and in contact with the second spacer layer, the superlattice layer having first layers made of a third nitride semiconductor and second layers made of a fourth nitride semiconductor smaller in lattice constant than the third nitride semiconductor stacked alternately on top of one another, and
an average lattice constant of the superlattice layer is smaller than a lattice constant of the first spacer layer and larger than a lattice constant of the second spacer layer.

2. The nitride semiconductor element of claim 1, further comprising an intermediate layer between the initial layer and the first spacer layer.

3. The nitride semiconductor element of claim 2, wherein an aluminum content of the first spacer layer is smaller than that of the second spacer layer and that of the intermediate layer.

4. The nitride semiconductor element any one of claims 1, 2 and 3, wherein:
the first spacer layer is made of GaN, and the second spacer layer is made of AlN.

5. The nitride semiconductor element any one of claims 1, 2 and 3, wherein a thickness of the first spacer layer is in a range of 40 nm to 500 nm.

6. The nitride semiconductor element any one of claims 1, 2 and 3, wherein the second spacer layer is made of AlN.

7. The nitride semiconductor element any one of claims 1, 2 and 3, wherein a thickness of the second spacer layer is in a range of 5 nm to 30 nm.

8. The nitride semiconductor element any one of claims 1, 2 and 3, wherein:
the first layers are made of $Al_x Ga_{1-x} N$, and the second layers are made of $Al_y Ga_{1-y} N (x<y\leq 1)$.

9. The nitride semiconductor element of claim 8, wherein the first layers are smaller in lattice constant than the first spacer layer.

10. The nitride semiconductor element of claim 8, wherein a bottommost layer of the superlattice layer is the first layer.

11. The nitride semiconductor element of claim 8, wherein each one of the first layers is thinner than the first spacer layer.

12. The nitride semiconductor element of claim 8, wherein each one of the second layers is thinner than the second spacer layer.

13. The nitride semiconductor element of claim 8, wherein a thickness of each of the first layers is in a range of 20 nm to 30 nm, and a thickness of each of the second layers is in a range of 3 nm to 6 nm.

14. The nitride semiconductor element any one of claims 1, 2 and 3, wherein the first layers are made of $Al_xGa_{1-x}N (0<x<0.5)$.

15. The nitride semiconductor element of claim 1, further comprising an intermediate layer between the initial layer and the first spacer layer, wherein:
the first spacer layer is made of GaN,
the second spacer layer is made of AlN,
the first layers are made of $Al_x Ga_{1-x} N$, and
the second layers are made of $Al_y Ga_{1-y} N (x<y\leq 1)$.

16. The nitride semiconductor element of claim 15, wherein the first layers are made of $Al_xGa_{1-x}N (0<x<0.5)$.

17. The nitride semiconductor element any one of claims 1, 2, 3, 15 and 16, wherein a plurality of strain suppression layers are formed between the substrate and the operation layer.

18. The nitride semiconductor element any one of claims 1, 2, 3, 15 and 16, serving as a transistor.

19. The nitride semiconductor element of claim 18, wherein the operation layer includes a channel layer.

20. The nitride semiconductor element of claim 19, wherein the channel layer is a GaN layer.

21. The nitride semiconductor element of claim 19, wherein a thickness of the channel layer is more than 0.5 μm and less than 6 μm.

22. The nitride semiconductor element any one of claims 1, 2, 3, 15 and 16, serving as a diode.

* * * * *